United States Patent [19]

Mattfeld

[11] 4,313,221
[45] Jan. 26, 1982

[54] MIXER/OSCILLATOR CIRCUIT

[75] Inventor: Johann Mattfeld, Unterheinriet, Fed. Rep. of Germany

[73] Assignee: Licentia Patent-Verwaltungs-G.m.b.H., Frankfurt am Main, Fed. Rep. of Germany

[21] Appl. No.: 139,114

[22] Filed: Apr. 10, 1980

[30] Foreign Application Priority Data

Jul. 24, 1979 [DE] Fed. Rep. of Germany ....... 2929918

[51] Int. Cl.³ .............................................. H04B 1/28
[52] U.S. Cl. .................................. 455/319; 455/333
[58] Field of Search ............... 455/318, 319, 323, 333; 332/9 T, 16 T, 31 T

[56] References Cited

U.S. PATENT DOCUMENTS

| | | | |
|---|---|---|---|
| 3,579,115 | 5/1971 | Goncharoff | 455/318 |
| 3,949,306 | 4/1976 | Watanabe et al. | 455/333 |
| 4,058,771 | 11/1977 | Ohsawa et al. | 455/333 |
| 4,194,158 | 3/1980 | Tanabe | 455/333 |

FOREIGN PATENT DOCUMENTS 1107488  3/1968  United Kingdom .

Primary Examiner—Jin F. Ng
Attorney, Agent, or Firm—Spencer & Kaye

[57] ABSTRACT

A mixer/oscillator circuit comprises a mixer stage to which an oscillator stage is connected, an emitter follower circuit being connected between the oscillator stage and the mixer stage.

2 Claims, 1 Drawing Figure

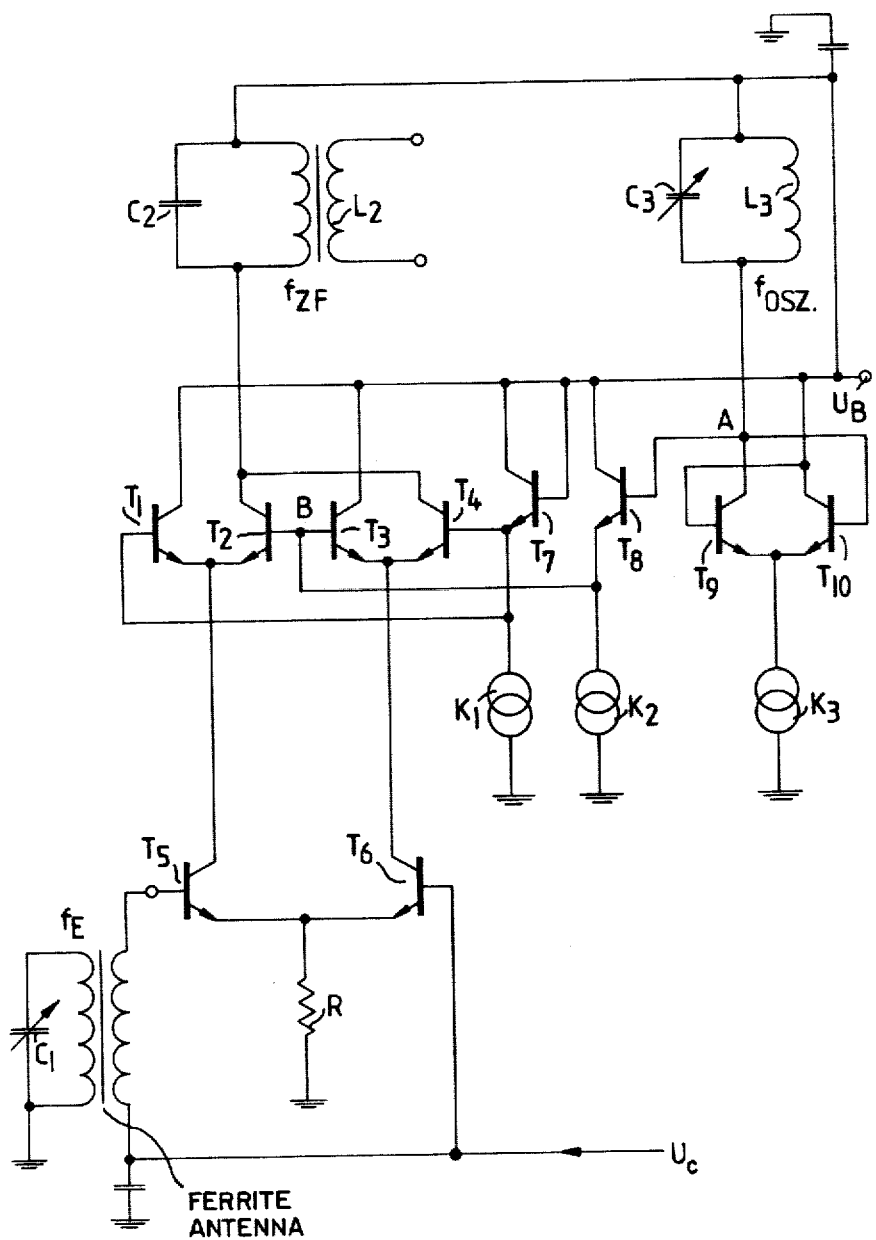

MIXER/OSCILLATOR CIRCUIT

BACKGROUND OF THE INVENTION

The invention relates to a mixer/oscillator circuit comprising a mixer stage with an oscillator stage cconnected thereto.

When coupling an oscillator to a controlled mixer stage, the oscillator frequency may be affected. This is because a change in the control voltage causes changes in the current in transistors in the mixer stage. The impedance of the base emitter path of the transistor however depends on currents and thus changes with the collector current or the emitter current. The changes in impedance at the base electrode of the mixing stage transistors brought about by changes in the control voltage and at the same time forming the input terminal for the signal at the oscillator frequency, thus load the resonant oscillator circuit and cause changes in frequency therein. This is true particularly of changes in the transistor capacitances which have a disruptive effect particularly at fairly high frequencies. Moreover, the impedances of the mixer stage transistors are also affected by changes in the input signal and the operating voltage in a manner which has back effect on the oscillator frequency, when the oscillator is connected directly to the mixing stage.

SUMMARY OF THE INVENTION

It is an object of the invention to prevent the oscillator frequency from being affected as far as possible by changes in impedance in the mixer stage which are initiated predominantly by changes in the control voltage.

According to the invention there is provided a mixer/oscillator circuit comprising a mixer stage, an oscillator stage connected to said mixer stage and an emitter follower circuit connected between said mixer stage and said oscillator stage.

Further according to the invention, there is provided a mixer oscillator circuit comprising a mixer stage with an oscillator stage attached thereto, wherein an emitter follower is connected between said oscillator stage and said mixing stage.

BRIEF DESCRIPTION OF THE DRAWING

The invention will now be described in greater detail by way of example with reference to the drawing, the single FIGURE of which shows a circuit diagram of one embodiment of the invention.

DESCRIPTION OF THE PREFERRED EMBODIMENT

The invention proposes that, in a mixer/oscillator circuit, an emitter follower is inserted between the mixer stage and the oscillator stage. In a preferred embodiment the emitter follower comprises a bipolar transistor, the base electrode of which is connected to the output terminal of the oscillator stage, its collector is connected to the d.c. supply voltage source and its emitter electrode is connected to the input terminal of the mixer stage provided for the signal at oscillator frequency.

In the mixer stage, there is a four-quadrant mixing stage, for example, comprising four transistors connected together in pairs at their emitter electrodes, in which the signal at the oscillator frequency is supplied to the base electrodes of the two transistors lying in different pairs. With this type of four-quadrant mixing stage a base emitter diode is connected in the forward direction for the purpose of setting the d.c. base voltage between the collector electrode of the emitter follower and the base electrodes of the transistors which do not form the input of the mixing stages.

Referring now to the drawing, a four-quadrant mixer stage is shown in the Figure made up of transistors $T_1$, $T_2$ or $T_3$, $T_4$ which are connected together in pairs at their emitter electrodes. The base electrodes of the transistors $T_2$ and $T_3$, which are connected together and are in different pairs, form the input terminal of the mixer stage for the oscillator frequency signal. A resonant circuit comprising a capacitor $C_2$ and an inductance $L_2$, in which the intermediate frequency is produced and which is decoupled via the attached transformer is located in the collector circuit of the transistor $T_2$, which at the same time forms the collector circuit of the transistor $T_4$. The collector electrodes of the transistors $T_1$ and $T_3$ are connected to the d.c. supply voltage $U_B$.

The emitter electrodes of the transistor pair $T_1$, $T_2$ or $T_3$ and $T_4$ are located in the collector circuit of transistors $T_5$ and $T_6$, the emitter electrodes of which are similarly connected together and are connected to earth potential via a resistor R. The a.c. input signal is supplied to the base electrode of the transistor $T_5$ via a ferrite antenna and an externally connected variable capacitor $C_1$. The d.c. control voltage $U_c$ is given by the demodulator to the base electrodes of the transistors $T_5$ and $T_6$. The control voltage serves to control amplification and counter-acts excessive control caused by the input signal. This control voltage is obtained from the intermediate frequency amplifier being acted upon at the input side by the intermediate frequency signal from the mixing stage shown.

The oscillator stage comprises transistors $T_9$ and $T_{10}$ which are connected together at the emitter side, in which, in each case, the base electrode of one transistor is connected to the collector electrode of the other transistor. A constant current source $K_3$, which is constructed in known manner, lies in the emitter current circuit. The collector electrode of the transistor $T_{10}$ is connected to the d.c. supply voltage $U_B$, while the collector electrode of the transistor $T_9$ is connected via connection A, to a resonant circuit comprising a capacitance $C_3$ and an inductance $L_3$. The resonant circuit is in parallel with the oscillator. The other terminal of this resonant circuit of the oscillator is also connected to the d.c. supply voltage $U_B$ as is the intermediate frequency resonant circuit.

An emitter follower comprising a transistor $T_8$ is connected between the terminal A at the collector of transistor $T_9$, at which the signal at the oscillator frequency is derived, and the input terminal B at the mixing stage, which is formed by the base electrodes of the transistors $T_2$ and $T_3$. The base electrode of this transistor $T_8$ is connected to the point A, the emitter electrode is connected to the point B and to the constant current source $K_2$ in the emitter current circuit of this transistor and the collector is connected to the d.c. supply voltage $U_B$.

If this emitter follower were not present, then changes in impedance at terminal B would have a direct effect on point A so that the oscillator frequency would then change if these changes in impedance are capacitive or inductive changes. These changes in impedance are, as already mentioned, very disruptive, particularly at high frequencies in the short wave range and occur especially in controlled mixer stages.

An emitter follower is connected between the oscillator stage and the mixing stage, this emitter follower transforming the changes in impedance on the emitter side to the base side to an extent reduced by the amplification factor of the transistor $T_8$. Because transistor $T_8$ is a transistor having a relatively high current amplification, the changes in impedance at the point B scarcely continue to have any effect because of the conversion of the impedance at the point A by the emitter follower.

For reasons of symmetry a d.c. voltage potential has to be supplied to the base electrodes of transistors $T_4$ and $T_1$ this d.c. voltage potential being identical to the d.c. voltage potential at the point B. For this reason, the transistor diode from the base emitter path of the transistor $T_7$ is connected between the collector of the transistor $T_8$, or the positive pole of the battery voltage, and the base electrodes of the transistors $T_1$ and $T_4$. The collector base path of this transistor is short-circuited in preferred manner. A constant current source $K_1$, which is constructed in known manner, is arranged in the emitter current branch of this transistor as in the emitter current branch of the emitter follower $T_8$. Thus the d.c. supply voltage reduced by the base emitter voltage of the transistors $T_7$ or $T_8$ is applied to the base electrodes of all of the transistors of the mixing stage.

In the circuit shown only transistors of the same polarity, for example npn-transistors, are used. The circuit may also be constructed with pnp-transistors or with field-effect transistors with corresponding modifications. If the mixing and oscillator circuit completely or partially comprises field-effect transistors, then the emitter follower is advantageously replaced by a field-effect transistor source follower. The resonant circuits and ferrite antenna as well as the blocking capacitors are connected externally. All the remaining circuit elements are preferably housed in a single semiconductor body in integrated form.

The oscillator stage may also be constructed symmetrically with a resonant circuit between the two collectors of the transistors $T_9$ and $T_{10}$. Both collectors of these transistors are then connected symmetrically to the mixing stage via an emitter or source follower each.

It will be understood that the above description of the present invention is susceptible to various modifications changes and adaptions.

What is claimed is:

1. A mixer/oscillator circuit comprising:
   a four-quadrant mixer stage having a first input connected to receive a signal to be mixed and a second input and composed of four transistors each having a collector electrode, a base electrode and an emitter electrode, said transistors being arranged in pairs with said emitter electrodes of each pair being connected together, and said base electrode of one transistor of each pair being connected to said second input;
   an oscillator stage generating an alternating signal and having an output at which that alternating signal appears;
   an emitter follower having a collector electrode and connected between said oscillator stage output and said second input of said mixer stage; and
   a base-emitter diode connected between said emitter follower collector electrode and said base electrode of the other transistor of each said pair, said diode being poled to be conductive in its forward direction between said emitter follower collector electrode and said base electrode of said other transistor of each said pair for setting the d.c. voltage at said base electrodes of said other transistors.

2. A circuit as defined in claim 1, wherein said emitter follower comprises a bipolar transistor, having a base electrode connected to said output of said oscillator stage, a collector connected to a d.c. supply voltage source and an emitter electrode connected to said second input of said mixer stage.

* * * * *